(12) United States Patent
Kim et al.

(10) Patent No.: US 12,255,673 B2
(45) Date of Patent: Mar. 18, 2025

(54) ADAPTIVE RECEIVER FOR HIGH OUTPUT POWER SYSTEM AND TRANSCEIVER INCLUDING THE SAME

(71) Applicant: AGENCY FOR DEFENSE DEVELOPMENT, Daejeon (KR)

(72) Inventors: Ki Chul Kim, Daejeon (KR); Kyoungyoul Park, Daejeon (KR); Jihaeng Cho, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 13 days.

(21) Appl. No.: 18/334,413

(22) Filed: Jun. 14, 2023

(65) Prior Publication Data

US 2024/0259037 A1   Aug. 1, 2024

(30) Foreign Application Priority Data

Jan. 27, 2023 (KR) .......................... 10-2023-0011160

(51) Int. Cl.
   *H04B 1/04*   (2006.01)
   *H03F 3/193*   (2006.01)
   (Continued)

(52) U.S. Cl.
   CPC .......... *H04B 1/0475* (2013.01); *H03F 3/193* (2013.01); *H04B 1/16* (2013.01); *H04B 1/48* (2013.01); *H03F 2200/294* (2013.01)

(58) Field of Classification Search
   CPC .......... H04B 1/0475; H04B 1/16; H04B 1/38; H04B 1/40; H04B 1/44; H04B 1/48; H04B 2001/0408; H03F 3/193; H03F 3/20; H03F 2200/171; H03F 2200/294
   USPC ............... 375/144, 148, 219, 285, 296, 297; 370/278, 282, 286, 288–290; 381/94.1; 455/63.1, 67.13, 114.2, 114.3, 115.1
   See application file for complete search history.

(56) References Cited

U.S. PATENT DOCUMENTS

| 11,424,900 B2 | 8/2022 | Muharemovic et al. |
| 2008/0136645 A1* | 6/2008 | Lin .................... G06K 7/10346 340/572.4 |

(Continued)

FOREIGN PATENT DOCUMENTS

| CN | 108306096 A | * 7/2018 | ........... H01Q 1/2225 |
| KR | 1020050082551 A | 8/2005 | |

(Continued)

*Primary Examiner* — Young T. Tse
(74) *Attorney, Agent, or Firm* — Dilworth & Barrese, LLP.; Michael J. Musella, Esq.

(57) ABSTRACT

An adaptive receiver for a high output power system includes a band-pass filter that receives a transmission signal output from a transmitter and outputs a transmission signal for canceling a leakage signal from which noise has been removed, and a leakage signal canceller that includes a first metal layer through which the transmission signal for canceling the leakage signal flows and a second metal layer through which a transmission leakage signal by the transmission signal flows, in which the first metal layer and the second metal layer are disposed adjacent to each other to generate a coupling effect, the transmission leakage signal for canceling the leakage signal flows in a reverse direction to a direction in which the transmission leakage signal flows, and the transmission leakage signal is canceled.

17 Claims, 11 Drawing Sheets

(51) Int. Cl.
*H04B 1/16* (2006.01)
*H04B 1/48* (2006.01)

(56) References Cited

U.S. PATENT DOCUMENTS

| | | | |
|---|---|---|---|
| 2014/0169236 A1* | 6/2014 | Choi | H04L 5/1461 |
| | | | 370/278 |
| 2016/0087698 A1* | 3/2016 | Chang | H04B 1/525 |
| | | | 370/276 |
| 2018/0026776 A1* | 1/2018 | Lee | H04B 1/525 |
| | | | 370/278 |

FOREIGN PATENT DOCUMENTS

| | | | | | |
|---|---|---|---|---|---|
| KR | 20100128063 | A | | 12/2010 | |
| KR | 20110132815 | A | * | 12/2011 | ............ H04B 1/525 |
| KR | 101723233 | B1 | | 4/2017 | |
| KR | 102232377 | B1 | | 3/2021 | |
| KR | 20220088044 | A | * | 6/2022 | ............ G01S 7/023 |

\* cited by examiner

ADAPTIVE RECEIVER FOR HIGH OUTPUT POWER SYSTEM AND TRANSCEIVER INCLUDING THE SAME

CROSS-REFERENCE TO RELATED APPLICATION

This application claims priority to and the benefit of Korean Patent Application No. 10-2023-0011160 filed in the Korean Intellectual Property Office on Jan. 27, 2023, the entire contents of which are incorporated herein by reference.

BACKGROUND

(a) Field

Embodiments of the present invention relates to an adaptive receiver for a high output power system and a transceiver including the same.

(b) Description of the Related Art

For long-distance communication, there is a need to improve a communicable distance. As one method for improving a communicable distance, high transmit power may be used in a transmitter. However, increasing the transmission power in the transceiver increases a transmission leakage signal (current) delivered to the receiver.

In order to reduce such transmission leakage signal, a band-pass filter (BPF) may be used in the transmitter. Alternatively, the band-pass filter may be used in the receiver. However, the use of the band-pass filter within the transmitter reduces the transmit output power and efficiency of the transmitter. The use of the band-pass filter within the receiver increases a noise figure within the receiver. Simply using the band-pass filter in the transmitter and/or receiver may result in a loss of transceiver performance.

SUMMARY

Embodiments of the present disclosure attempts to provide an adaptive receiver for a high output power system and a transceiver including the same capable of attenuating a transmission leakage signal and controlling an operating region of a low noise amplifier.

According to an exemplary embodiment of the present invention, an adaptive receiver for a high output power system includes a band-pass filter that receives a transmission signal output from a transmitter and outputs a transmission signal for canceling a leakage signal from which noise has been removed, and a leakage signal canceller that includes a first metal layer through which the transmission signal for canceling the leakage signal flows and a second metal layer through which a transmission leakage signal by the transmission signal flows, in which the first metal layer and the second metal layer are disposed adjacent to each other to generate a coupling effect, the transmission leakage signal for canceling the leakage signal flows in a reverse direction to a direction in which the transmission leakage signal flows, and the transmission leakage signal is canceled.

The leakage signal canceller may further include a dielectric material layer positioned between the first metal layer and the second metal layer, and the first metal layer and the second metal layer may overlap each other with the dielectric material layer interposed therebetween.

The second metal layer may be formed in a coil shape on a plane, and the first metal layer may be formed in an opened ring shape on the plane and may partially overlap the second metal layer.

The first metal layer and the second metal layer may be positioned on the same layer and disposed to extend side by side at a certain distance.

The second metal layer may be formed in a coil shape on a plane, the first metal layer may extend and be disposed in an X-axis direction adjacent to a portion where the transmission leakage signal flows in an +X direction in the second metal layer, and the transmission signal for canceling the leakage signal may flow in a −X direction in the first metal layer.

The adaptive receiver may further include: a low noise amplifier that amplifies the received signal output by passing through the leakage signal canceller and removes noise; and a controller that controls a drain voltage and an inductance value of the low noise amplifier according to a magnitude of the transmission signal.

The low noise amplifier may include: an input matching unit that is connected to the leakage signal canceller; and a transistor that includes a gate electrode connected to the input matching unit, a drain electrode connected to a power voltage terminal, and a source electrode connected to the ground, and the controller may apply a control voltage to the drain electrode of the transistor, and increase the control voltage as the magnitude of the transmission signal increases to increase an input P1 dB of the low noise amplifier.

The input matching unit may include: a first matching metal layer; a second matching metal layer that overlaps the first matching metal layer and has one end connected to the leakage signal canceller and the other end connected to the gate electrode of the transistor; a first variable resistor and a second variable resistor that are connected to the first matching metal layer at different positions; a first switch that receives a first control signal from the controller and connects or disconnects the first variable resistor to or from the first matching metal layer; and a second switch that receives a second control signal from the controller and connects or disconnects the second variable resistor to or from the second matching metal layer.

The second matching metal layer may be formed in a coil shape on a plane, and the first matching metal layer may be formed in an opened ring shape on the plane and partially overlaps the second matching metal layer.

The controller may increase the inductance value of the low noise amplifier by reducing a resistance value of the first variable resistor or a resistance value of the second variable resistor when a voltage of the drain electrode of the transistor increases.

According to another exemplary embodiment of the present invention, a transceiver includes: a transmitter that outputs a transmission signal to a first node; a transmitting/receiving converter that includes a first terminal connected to the first node, a second terminal connected to an antenna, and a third terminal connected to a second node; a leakage signal canceller that is connected to the second node, receives a signal transmitted from the transmitting/receiving converter, and attenuates a transmission leakage signal and transmits the attenuated transmission leakage signal to a third node; and a band-pass filter that is connected to the first node to receive the transmission signal and outputs a transmission signal for canceling a leakage signal from which noise has been removed to a fourth node, in which the leakage signal canceller includes: a first metal layer that includes one end connected to a resistor and the other end connected to the fourth node; and a second metal layer that includes one end connected to the second node and the other end connected to the third node, and the first metal layer and the second metal layer are disposed adjacent to each other to generate a coupling effect.

The leakage signal canceller may further include a dielectric material layer positioned between the first metal layer and the second metal layer, and the first metal layer and the second metal layer may overlap each other with the dielectric material layer interposed therebetween.

The second metal layer may be formed in a coil shape on a plane, and the first metal layer may be formed in an opened ring shape on the plane and may partially overlap the second metal layer.

The first metal layer and the second metal layer may be positioned on the same layer and disposed to extend side by side at a certain distance.

The second metal layer may be formed in a coil shape on a plane, the first metal layer may extend and be disposed in an X-axis direction adjacent to a portion where the transmission leakage signal flows in an +X direction in the second metal layer, and the transmission signal for canceling the leakage signal may flow in a −X direction in the first metal layer.

The transceiver may further include: a low noise amplifier that is connected to the third node to receive and amplify the received signal output through the leakage signal canceller and remove noise; a detector that is connected to the first node to detect the transmission signal; and a controller that increases an input P1 dB of the low noise amplifier by increasing a drain voltage of the low noise amplifier as the magnitude of the transmission signal detected by the detector increases.

The low noise amplifier may include: a transistor; a first matching metal layer; a second matching metal layer that includes one end connected to the third node and the other end connected to a gate electrode of the transistor, and overlap the first matching metal layer; a first variable resistor and a second variable resistor that are connected to the first matching metal layer at different positions; a first switch that receives a first control signal from the controller and connects or disconnects the first variable resistor to or from the first matching metal layer; and a second switch that receives a second control signal from the controller and connects or disconnects the second variable resistor to or from the second matching metal layer, and the controller may increase the inductance value of the low noise amplifier by reducing a resistance value of the first variable resistor or a resistance value of the second variable resistor when a voltage of the drain electrode of the transistor increases.

A transmission leakage signal may be canceled using a transmission signal. An input P1 dB (maximum power point) of a low noise amplifier can be improved by using the transmission signal, and the impedance of the low noise amplifier can be optimized.

DETAILED DESCRIPTION

Figure 1:
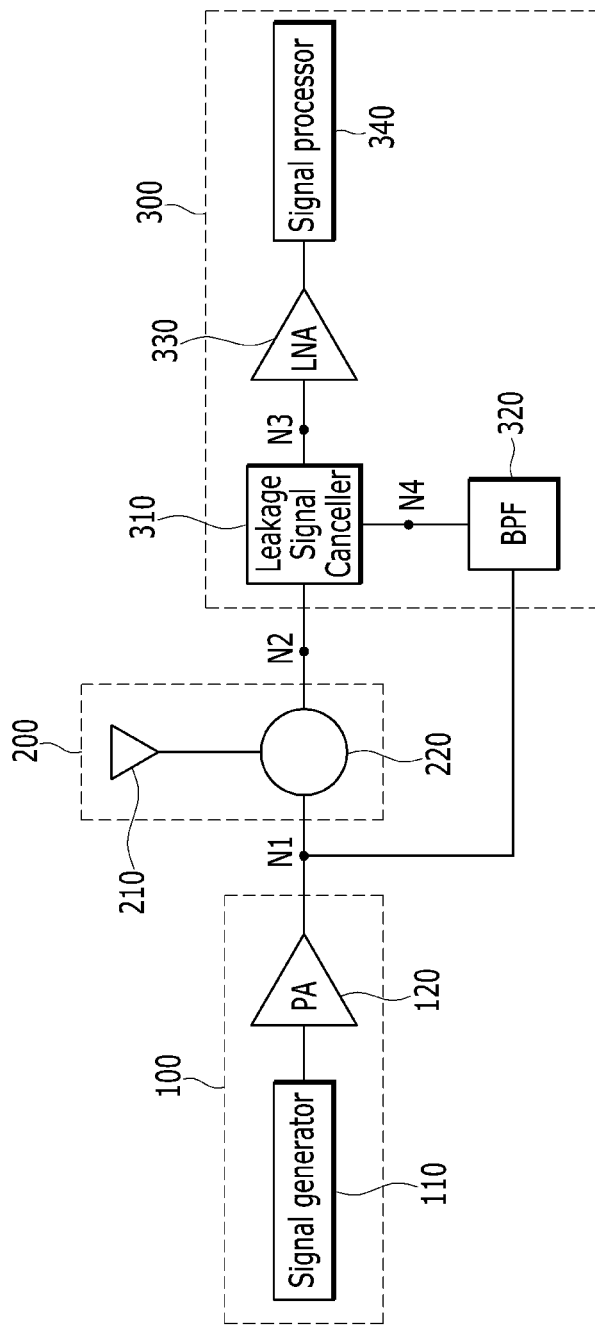
FIG. 1 is a diagram illustrating an adaptive receiver and a transceiver including the same for a high output power system according to an embodiment of the present invention.

Hereinafter, exemplary embodiments of the present invention will be described in detail with reference to the accompanying drawings so that those skilled in the art to which the present invention pertains may easily practice the present invention. However, the present invention may be implemented in various different forms and is not limited to exemplary embodiments provided herein.

Portions unrelated to the description will be omitted in order to obviously describe the present invention, and similar components will be denoted by the same or similar reference numerals throughout the present specification.

In addition, unless explicitly described to the contrary, the word "comprise", and variations such as "comprises" or "comprising", will be understood to imply the inclusion of stated elements but not the exclusion of any other elements.

Hereinafter, referring to FIGS. 1 to 6, an adaptive receiver and a transceiver including the same for a high output power system according to an embodiment of the present invention will be described.

FIG. 1 is a diagram illustrating an adaptive receiver and a transceiver including the same for a high output power system according to an embodiment of the present invention.

Referring to FIG. 1, a transceiver according to an exemplary embodiment of the present invention includes a transmitter 100, an antenna unit 200, and a receiver 300.

The transmitter 100 may include a signal generator 110 and a power amplifier 120. The signal generator 110 generates a transmission signal and transmits the generated transmission signal to an input terminal of the power amplifier 120. The power amplifier 120 includes an input terminal connected to the signal generator 110 and an output terminal connected to the first node N1. The power amplifier 120 may amplify a transmission signal input through the input terminal and output the amplified transmission signal to a first node N1 through the output terminal.

The antenna unit 200 may include an antenna 210 and a transmitting/receiving converter 220. The transmitting/receiving converter may include a first terminal connected to the first node N1, a second terminal connected to an antenna, and a third terminal connected to a second node N2. The transmitting/receiving converter 220 may transmit the transmission signal input through the first terminal to the antenna 210 through the second terminal. The transmitting/receiving converter 220 may transmit the received signal received by the antenna 210 and input through the second terminal to the second node N2 through the third terminal. The transmitting/receiving converter 220 may include a circulator, a duplexer, a diplexer, and the like.

Meanwhile, the transmission signal output from the transmitter 100 having high transmit power may generate a transmission leakage signal directly leaked to the receiver 300 through the transmitting/receiving converter 220. The transmission leakage signal by the transmission signal may be transmitted to the second node N2.

The receiver 300 may include a leakage signal canceller 310, a band-pass filter 320, a low noise amplifier 330, and a signal processor 340. The leakage signal canceller 310 is connected to the second node N2, a third node N3, and a fourth node N4. The band-pass filter 320 may include the input terminal connected to the first node N1 and the output terminal connected to the fourth node N4. The low noise amplifier 330 may include the input terminal connected to the third node N3 and the output terminal connected to the signal processor 340.

The band-pass filter 320 is connected to the first node N1 and receives the transmission signal output from the power amplifier 120 as the input terminal. The band-pass filter 320 may output the transmission signal for canceling the leakage signal from which noise other than the transmission signal has been removed to the fourth node N4 through the output terminal.

The leakage signal canceller 310 may be connected to the second node N2 to receive a signal transmitted from the transmitting/receiving converter 220, and attenuate the transmission leakage signal and transmit the attenuated transmission leakage signal to the third node N3. The leakage signal canceller 310 receives the transmission leakage signal transmitted from the transmitting/receiving converter 220 to the second node N2. The leakage signal canceller 310 receives the transmission signal for canceling the leakage signal output from the band-pass filter 320 to the fourth node N4. The leakage signal canceller 310 may cancel the transmission leakage signal by using the transmission signal for canceling the leakage signal received through the band-pass filter 320. The leakage signal canceller 310 may include a first wiring through which the transmission signal for canceling the leakage signal is transmitted and a second wiring through which the transmission leakage signal is transmitted. The second wiring is a main wiring through which the received signal received by the antenna 210 is transmitted. Since the first wiring and the second wiring are spaced apart from each other by a predetermined distance, a coupling effect of generating an induced current may be generated. The leakage signal canceller 310 may cancel the transmission leakage signal due to the coupling effect by allowing the transmission signal for canceling the leakage signal to flow in a reverse direction to the direction in which the transmission leakage signal flows.

The band-pass filter 320 may transmit only the transmission signal to the leakage signal canceller 310 to minimize the effect on the received signal received by the antenna 210. The leakage signal canceller 310 may pass the received signal received by the antenna 210 as it is and output the received signal to the third node N3.

The low noise amplifier 330 is connected to the third node N3 and receives the received signal output through the leakage signal canceller 310. The low noise amplifier 330 may amplify the received signal, remove noise, and transmit the received signal to the signal processor 340.

The signal processor 340 may process the received signal to acquire received data.

Figure 2:
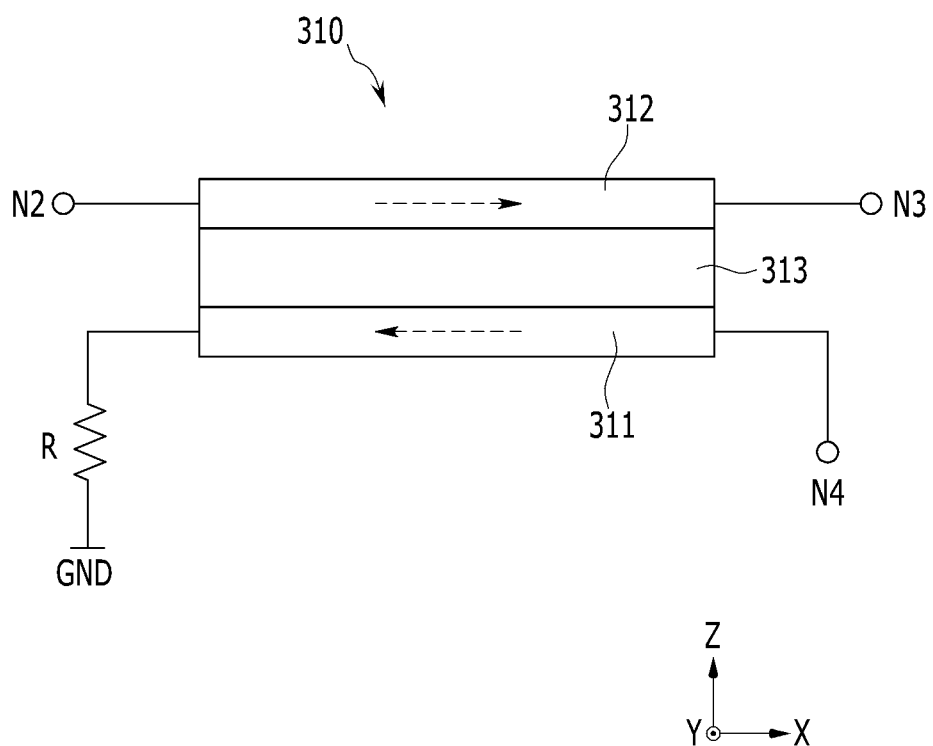
FIG. 2 is a diagram illustrating a leakage signal canceller according to an exemplary embodiment of the present invention.

FIG. 2 is a diagram illustrating a leakage signal canceller according to an embodiment of the present invention.

Referring to FIG. 2, the leakage signal canceller 310 may include a first metal layer 311, a second metal layer 312, and a dielectric layer 313. The first metal layer 311 corresponds to the first wiring described above in the exemplary embodiment of FIG. 1. The second metal layer 312 corresponds to the second wiring described above in the exemplary embodiment of FIG. 1. The first metal layer 311 and the second metal layer 312 are positioned on different layers on an X-Y plane. The first metal layer 311 and the second metal layer 312 overlap (overlap in the Z-axis direction) each other with the dielectric layer 313 interposed therebetween. The first metal layer 311 and the second metal layer 312 may generate the coupling effect by being disposed adjacent to each other.

The first metal layer 311 includes one end connected to a resistor R and the other end connected to the fourth node N4. The resistor R may have a resistance value of approximately 50 ohms. The resistance value of the resistor R may change according to the difference in characteristic impedance of the first metal layer 311.

The second metal layer 312 includes one end connected to the second node N2 and the other end connected to the third node N3. One end of the second metal layer 312 may be adjacent to (overlap) one end of the first metal layer 311, and the other end of the second metal layer 312 may be adjacent to (overlap) the other end of the first metal layer 311.

The transmission leakage signal of the second node N2 flows toward the third node N3 through the second metal layer 312. The transmission leakage signal flows from one end of the second metal layer 312 to the other end of the second metal layer 312. In this case, the transmission signal for canceling the leakage signal of the fourth node N4 flows toward the resistor R through the first metal layer 311. The transmission signal for canceling the leakage signal flows from the other end of the first metal layer 311 to one end of the first metal layer 311. That is, the transmission signal for canceling the leakage signal flows in a reverse direction (−X direction) to a direction (+X direction) in which the transmission leakage signal flows. Accordingly, the transmission leakage signal and the transmission signal for canceling the leakage signal are canceled with each other due to the coupling effect.

Figure 3:
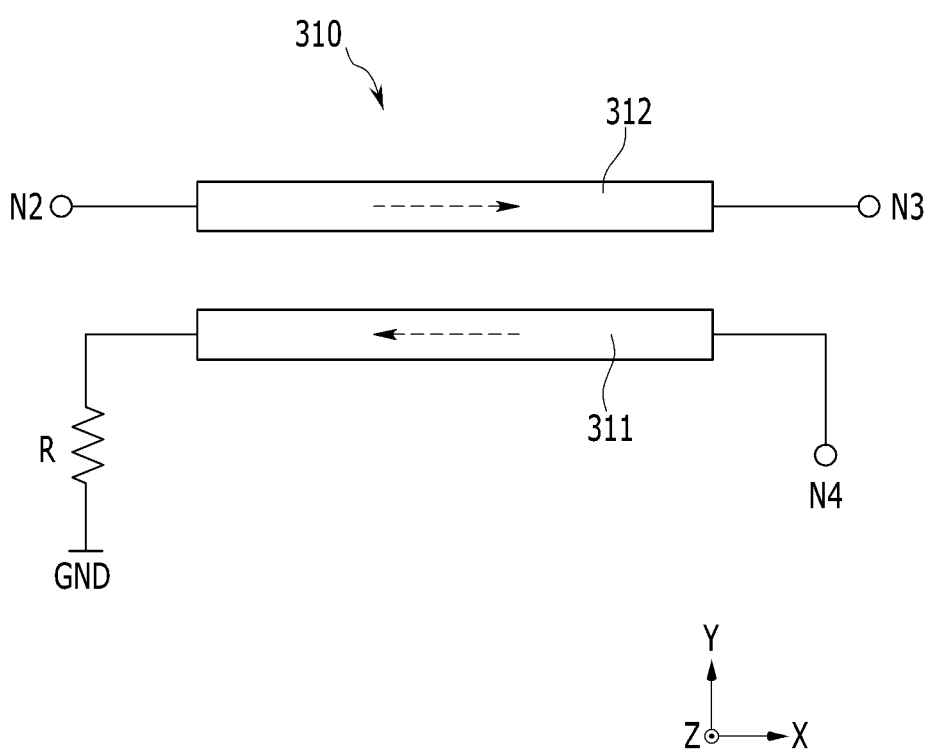
FIG. 3 is a diagram illustrating a leakage signal canceller according to another exemplary embodiment of the present invention.

FIG. 3 is a diagram illustrating a leakage signal canceller according to another exemplary embodiment of the present invention.

Referring to FIG. 3, the leakage signal canceller 310 may include the first metal layer 311 and the second metal layer 312. The first metal layer 311 corresponds to the first wiring described above in the exemplary embodiment of FIG. 1. The second metal layer 312 corresponds to the second wiring described above in the exemplary embodiment of FIG. 1. The first metal layer 311 and the second metal layer 312 are positioned on the same layer on the X-Y plane. The first metal layer 311 and the second metal layer 312 may be disposed to extend (extend in the X-axis direction) side by side at a predetermined distance. One end of the second metal layer 312 may be adjacent to one end of the first metal layer 311, and the other end of the second metal layer 312 may be adjacent to (overlap) the other end of the first metal layer 311.

Even in this arrangement structure, as described in the embodiment of FIG. 2, as the transmission signal for canceling the leakage signal flows in the reverse direction (−X direction) to the direction (+X direction) in which the transmission leakage signal flows, the transmission leakage signal and the transmission signal for canceling the leakage signal may be canceled with each other due to the coupling effect.

Figure 4:
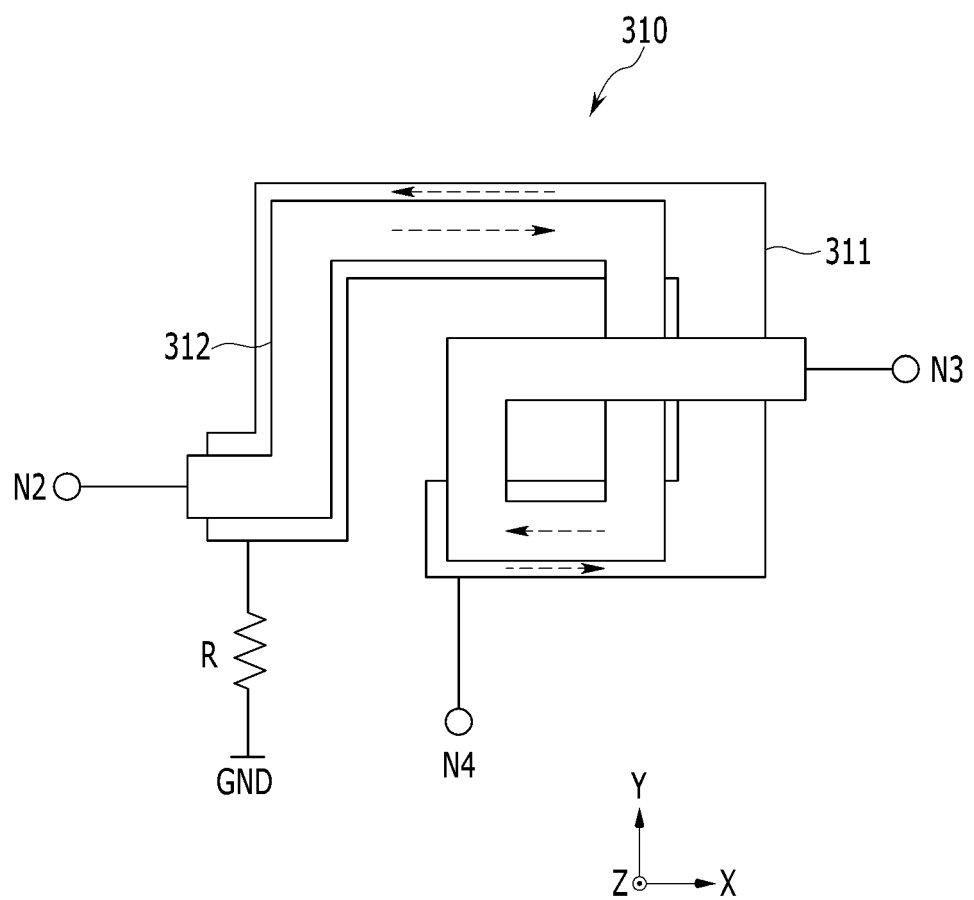
FIG. 4 is a diagram illustrating a leakage signal canceller according to another exemplary embodiment of the present invention.

FIG. 4 is a diagram illustrating a leakage signal canceller according to another exemplary embodiment of the present invention.

Referring to FIG. 4, the leakage signal canceller 310 may include the first metal layer 311, the second metal layer 312, and the dielectric layer (not illustrated). The first metal layer 311 corresponds to the first wiring described above in the exemplary embodiment of FIG. 1. The second metal layer 312 corresponds to the second wiring described above in the exemplary embodiment of FIG. 1. FIG. 4 illustrates the first metal layer 311 and the second metal layer 312 on the X-Y plane, and the dielectric layer positioned between the first metal layer 311 and the second metal layer 312 is not illustrated. The first metal layer 311 and the second metal layer 312 are positioned on different layers on an X-Y plane. The first metal layer 311 and the second metal layer 312 overlap (overlap in the X-axis direction) each other with the dielectric layer interposed therebetween. The first metal layer 311 and the second metal layer 312 may generate the coupling effect.

The second metal layer 312 may be formed in a coil shape (inductor shape) on the X-Y plane. One end of the coil-shaped second metal layer 312 is connected to the second node N2, and the other end of the coil-shaped second metal layer 312 is connected to the third node N3.

The first metal layer 311 may be formed in an opened ring shape (loop shape) on the X-Y plane and partially overlap the second metal layer 312. One end of the first metal layer 311 is connected to the resistor R, and the other end of the first metal layer 311 is connected to the fourth node N4. The first metal layer 311 and the second metal layer 312 may be disposed so that one end of the second metal layer 312 and one end of the first metal layer 311 are adjacent to (overlap) each other.

The transmission leakage signal of the second node N2 flows toward the third node N3 through the second metal layer 312. In this case, the transmission signal for canceling the leakage signal of the fourth node N4 flows toward the resistor R through the first metal layer 311. In a portion where the first metal layer 311 and the second metal layer 312 overlap each other, the transmission leakage signal and the transmission signal for canceling the leakage signal flow in an opposite direction to each other. Accordingly, the transmission leakage signal and the transmission signal for canceling the leakage signal are canceled with each other due to the coupling effect.

Figure 5:
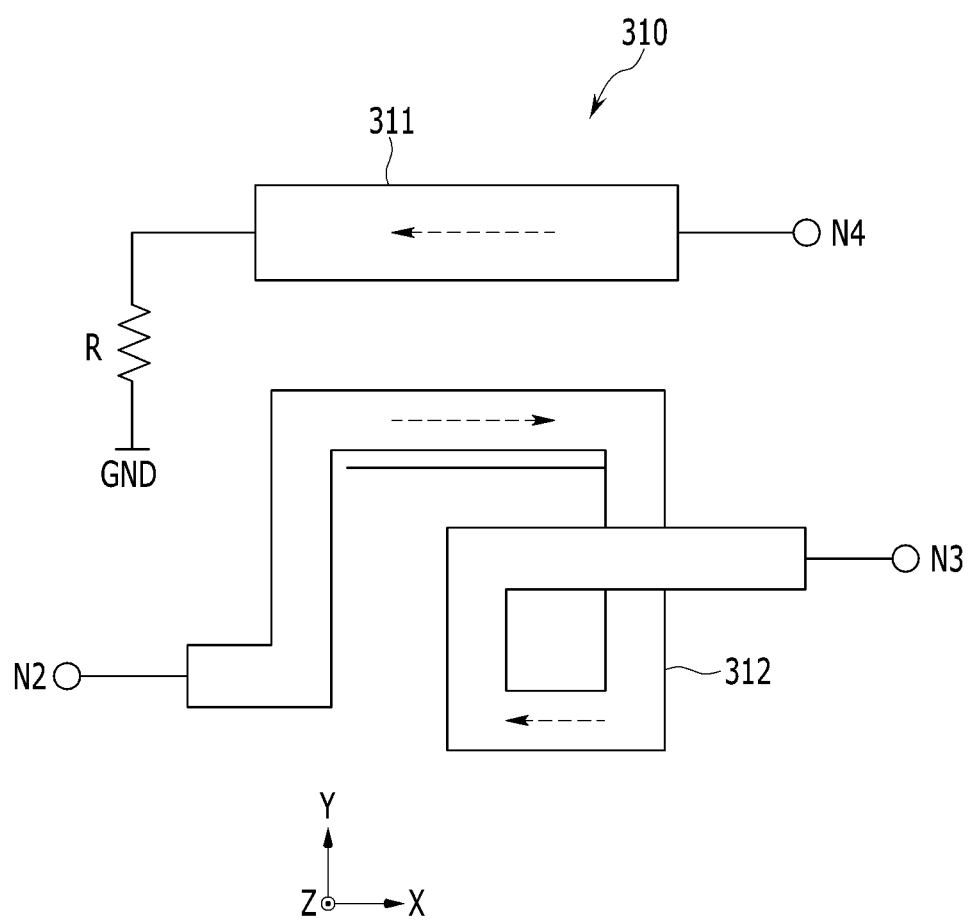
FIG. 5 is a diagram illustrating a leakage signal canceller according to another exemplary embodiment of the present invention.

FIG. 5 is a diagram illustrating a leakage signal canceller according to another exemplary embodiment of the present invention.

Referring to FIG. 5, the leakage signal canceller 310 may include the first metal layer 311 and the second metal layer 312. The first metal layer 311 corresponds to the first wiring described above in the exemplary embodiment of FIG. 1. The second metal layer 312 corresponds to the second wiring described above in the exemplary embodiment of FIG. 1. The first metal layer 311 and the second metal layer 312 are positioned on the same layer on the X-Y plane.

The second metal layer 312 may be formed in a coil shape (inductor shape) on the X-Y plane. One end of the coil-shaped second metal layer 312 is connected to the second node N2, and the other end of the coil-shaped second metal layer 312 is connected to the third node N3.

The first metal layer 311 may be disposed adjacent to a portion of the second metal layer 312 where the transmission leakage signal flows in the +X direction and disposed to extend in the X-axis direction. The first metal layer 311 is configured such that transmission signal for canceling the leakage signal flow in the −X direction. That is, the transmission signal for canceling the leakage signal flows in the −X direction from the other end of the first metal layer 311 to one end of the first metal layer 311.

As the transmission signal for canceling the leakage signal flows in the reverse direction (−X direction) to the direction (+X direction) in which the transmission leakage signal flows, the transmission leakage signal and the transmission signal for canceling the leakage signal may be canceled with each other due to the coupling effect.

Figure 6:
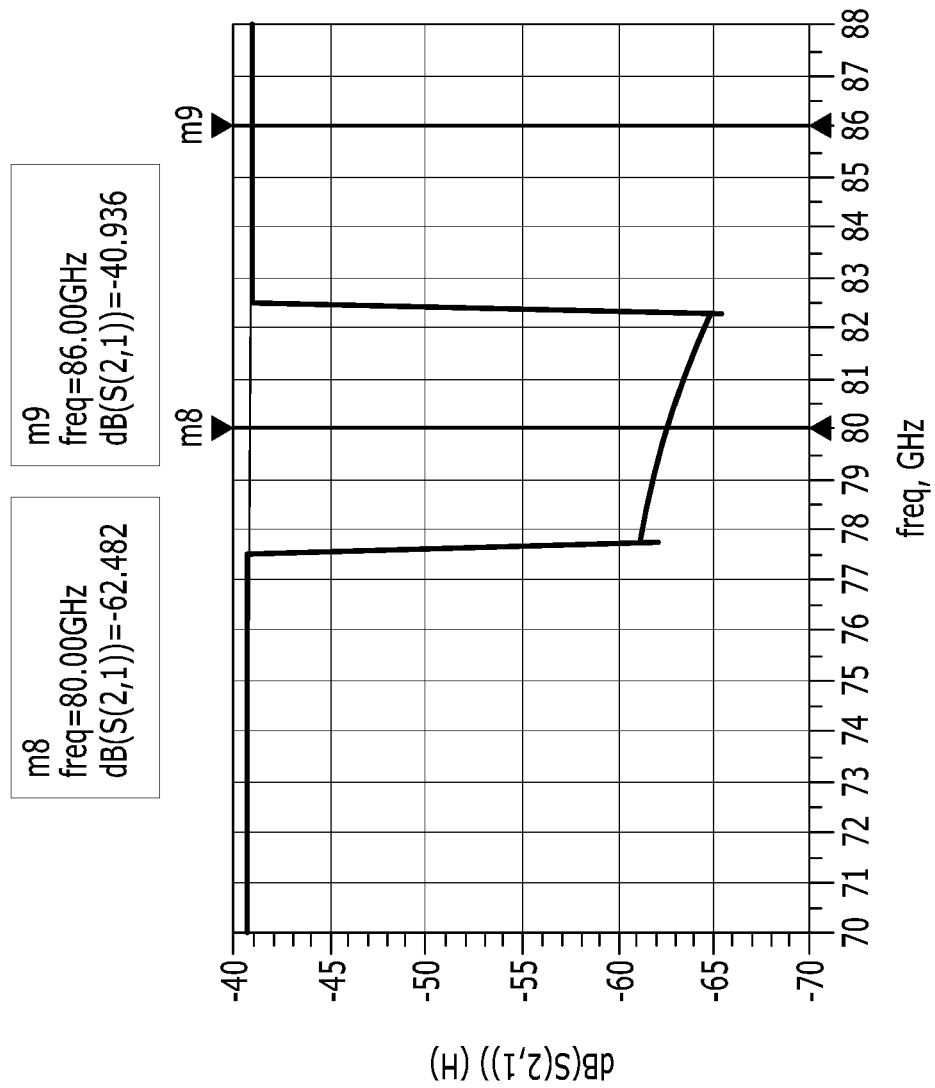
FIG. 6 is a diagram illustrating simulation results of the leakage signal canceller according to the exemplary embodiment of the present invention.

FIG. 6 is a diagram illustrating simulation results of the leakage signal canceller according to the exemplary embodiment of the present invention.

Referring to FIG. 6, when the leakage signal canceller 310 does not operate, the level of the transmission leakage signal is −40.852 dB. This may vary according to the characteristics of the transmitting/receiving converter 220.

On the other hand, when the leakage signal canceller 310 operates, the level of the transmission leakage signal is approximately −62.482 dB. It shows that there is a canceling effect of the transmission leakage signal of about 21.63 dB.

Hereinafter, referring to FIGS. 7 to 11, an adaptive receiver and a transceiver including the same for a high output power system according to another embodiment of the present invention will be described. Compared to the embodiments of FIGS. 1 to 6, the description will focus on differences and descriptions of the same features will be omitted.

Figure 7:
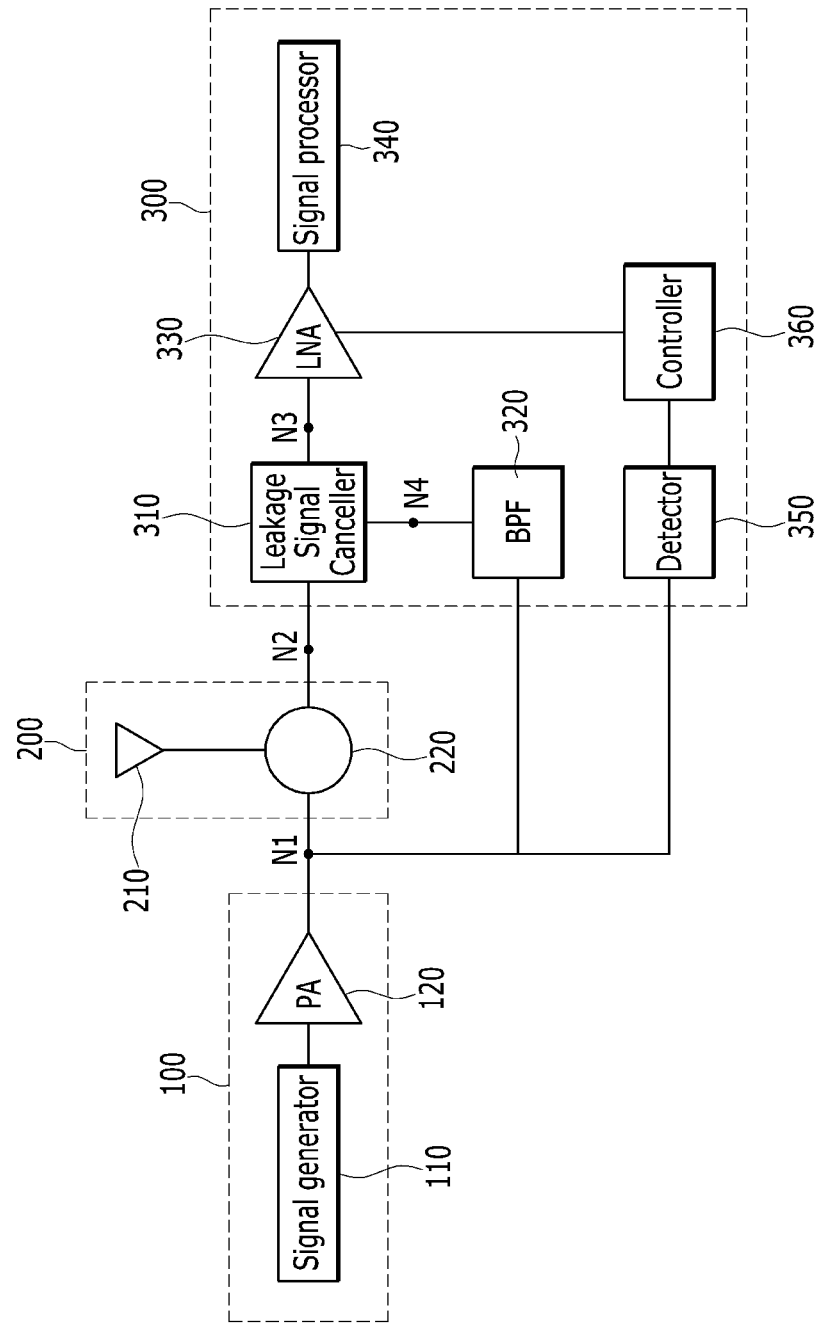
FIG. 7 is a diagram illustrating an adaptive receiver and a transceiver including the same for a high output power system according to another exemplary embodiment of the present invention.

FIG. 7 is a diagram illustrating an adaptive receiver and a transceiver including the same for a high output power system according to another exemplary embodiment of the present invention.

Referring to FIG. 7, even if the transmission leakage signal is canceled by the leakage signal canceller 310, the remaining transmission leakage signal is high, so the phenomenon that the low noise amplifier 330 is saturated may occur. Alternatively, the low noise amplifier 330 may be saturated by an externally applied signal level.

In order to prevent this phenomenon, in the transceiver according to another embodiment of the present invention, the receiver 300 may further include a detector 350 and a controller 360.

The detector 350 is connected to the first node N1. The detector 350 may detect a transmission signal at the first node N1. The detector 350 transfers the detected transmission signal to the controller 360.

The controller 360 generates a control voltage and a control signal according to the magnitude of the transmission signal detected by the detector 350 and inputs the generated control voltage and control signal to the low noise amplifier 330. The controller 360 may control a drain voltage and an inductance value of the low noise amplifier 330. An input P1 dB (maximum power point) of the low noise amplifier may be improved corresponding to the magnitude of the transmission signal, and the impedance of the low noise amplifier may be optimized.

Since other components of the adaptive receiver for the high output power system and the transceiver including the same are the same as those described in the exemplary embodiments of FIGS. 1 to 6, descriptions of other components will be omitted.

Figure 8:
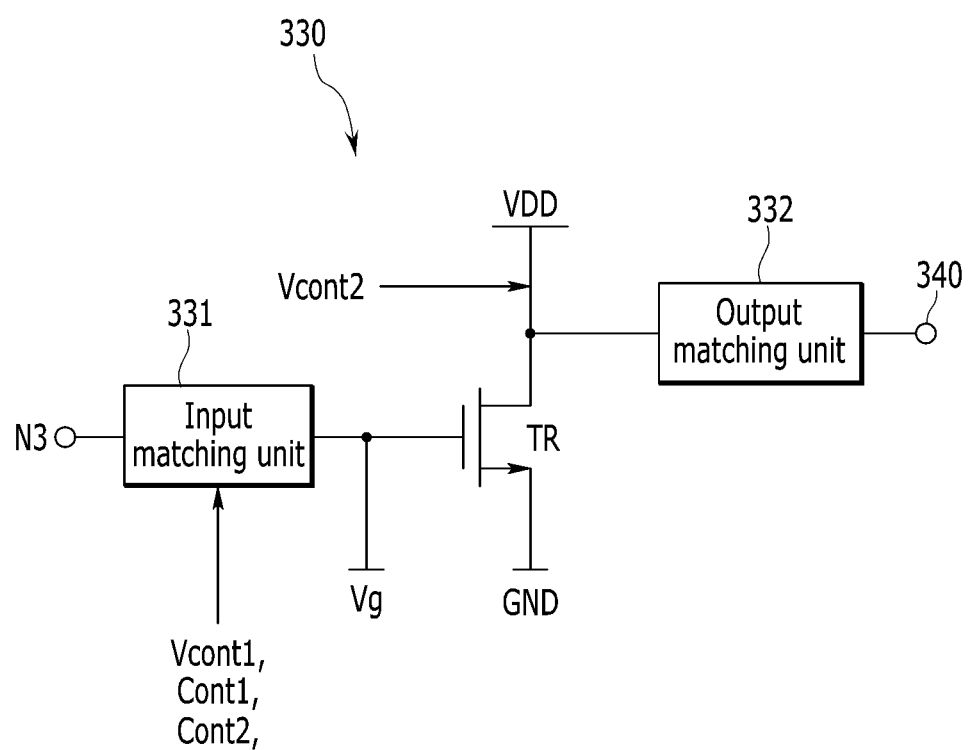
FIG. 8 is a diagram illustrating a low noise amplifier according to an exemplary embodiment of the present invention.

FIG. 8 is a diagram illustrating a low noise amplifier according to an exemplary embodiment of the present invention.

Referring to FIG. 8, the low noise amplifier 330 may include an input matching unit 331, a transistor TR, and an output matching unit 332. FIG. 8 illustrates a one-stage low noise amplifier 330. The low noise amplifier 330 may be configured with multiple stages, and the control method of the drain voltage and the inductance value may also be applied to the multi-stage low noise amplifier 330.

The input matching unit 331 is connected to the third node N3 and a gate voltage terminal Vg. The input matching unit 331 receives a first control voltage Vcont1 and control signals Cont1 and Cont2 applied from the controller 360. The inductance value of the input matching unit 331 may be controlled by the first control voltage Vcont1 and the control signals Cont1 and Cont2. The input matching unit 331 processes the signal input from the third node N3 and outputs the processed signal to the gate voltage terminal Vg.

The transistor TR includes a gate electrode connected to the gate voltage terminal Vg, a drain electrode connected to a power voltage terminal VDD, and a source electrode connected to a ground GND. A transistor TR may be an N-type transistor.

A second control voltage Vcont2 is applied to the drain electrode of the transistor TR from the controller 360. The input P1 dB of the low noise amplifier 330 may be controlled by the second control voltage Vcont2. The controller 360 may increase the second control voltage Vcont2 as the magnitude of the transmission signal increases and apply the second control voltage Vcont2 to the drain electrode of the transistor TR. As the voltage (drain voltage) of the drain electrode of the transistor TR increases, the input P1 dB of the low noise amplifier 330 increases. For example, when the voltage of the drain electrode of the transistor TR is controlled to 1V to 4V, the input P1 dB of the low noise amplifier 330 is controlled to −1.4 dBm to +11 dBm (when the voltage of the drain electrode is 1V, the input P1 dB is −1.4 dBm, when the voltage of the drain electrode is 2V, the input P1 dB is 4.4 dBm, when the voltage of the drain electrode is 3V, the input P1 dB is 8 dBm, and when the voltage of the drain electrode is 4V, the input P1 dB is 11 dBm).

The output matching unit 332 is connected to the drain electrode of the transistor TR and the signal processor 340. The output matching unit 332 may process a signal input from the drain electrode of the transistor TR and output the processed signal to the signal processor 340.

The change in the voltage of the drain electrode of the transistor TR results in a change in the optimum input impedance. The change in the optimum input impedance may be satisfied by controlling the inductance value of the input matching unit 331.

Figure 9:
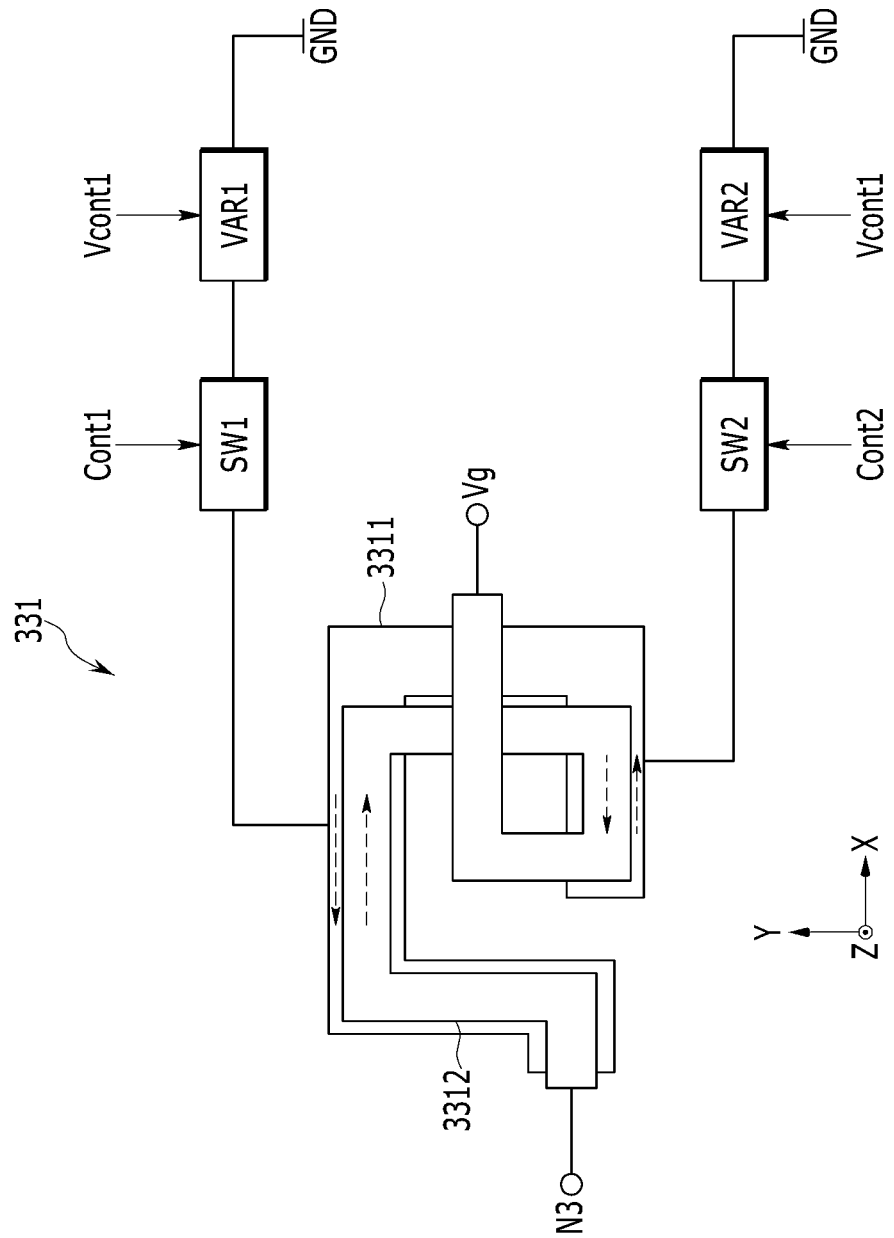
FIGS. 9 and 10 are diagrams illustrating an input matching unit according to an exemplary embodiment of the present invention.
Figure 10:
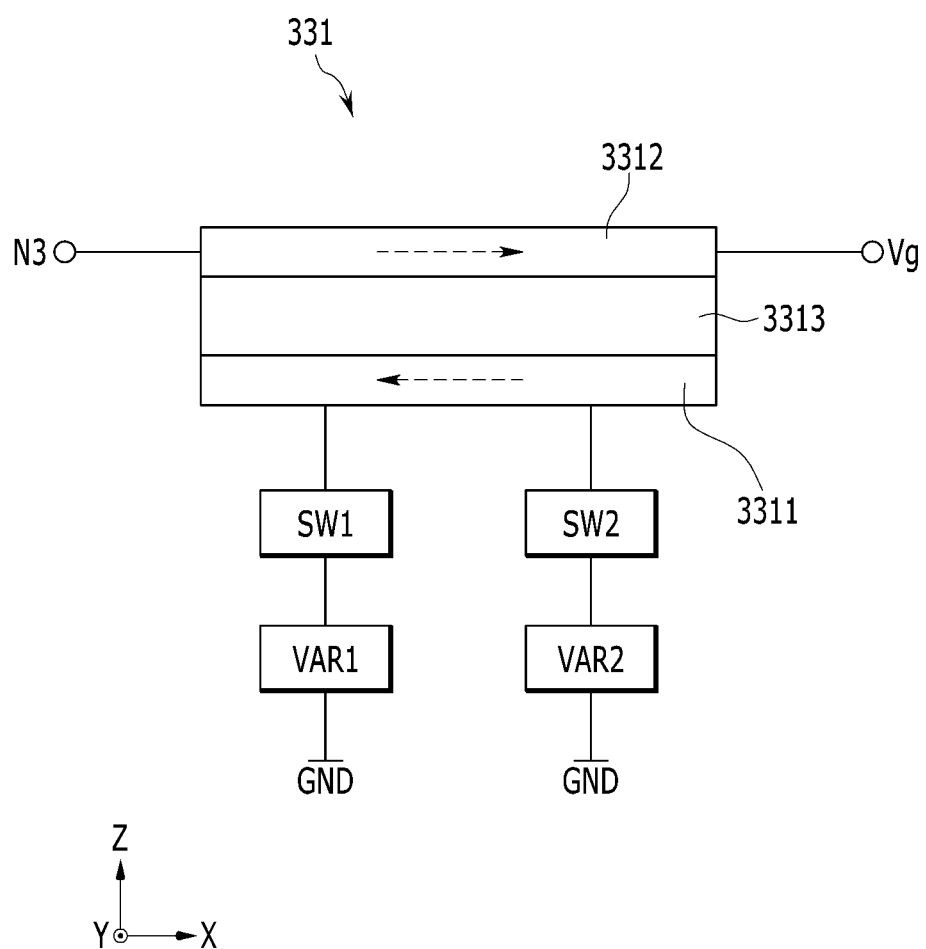
Figure 11:
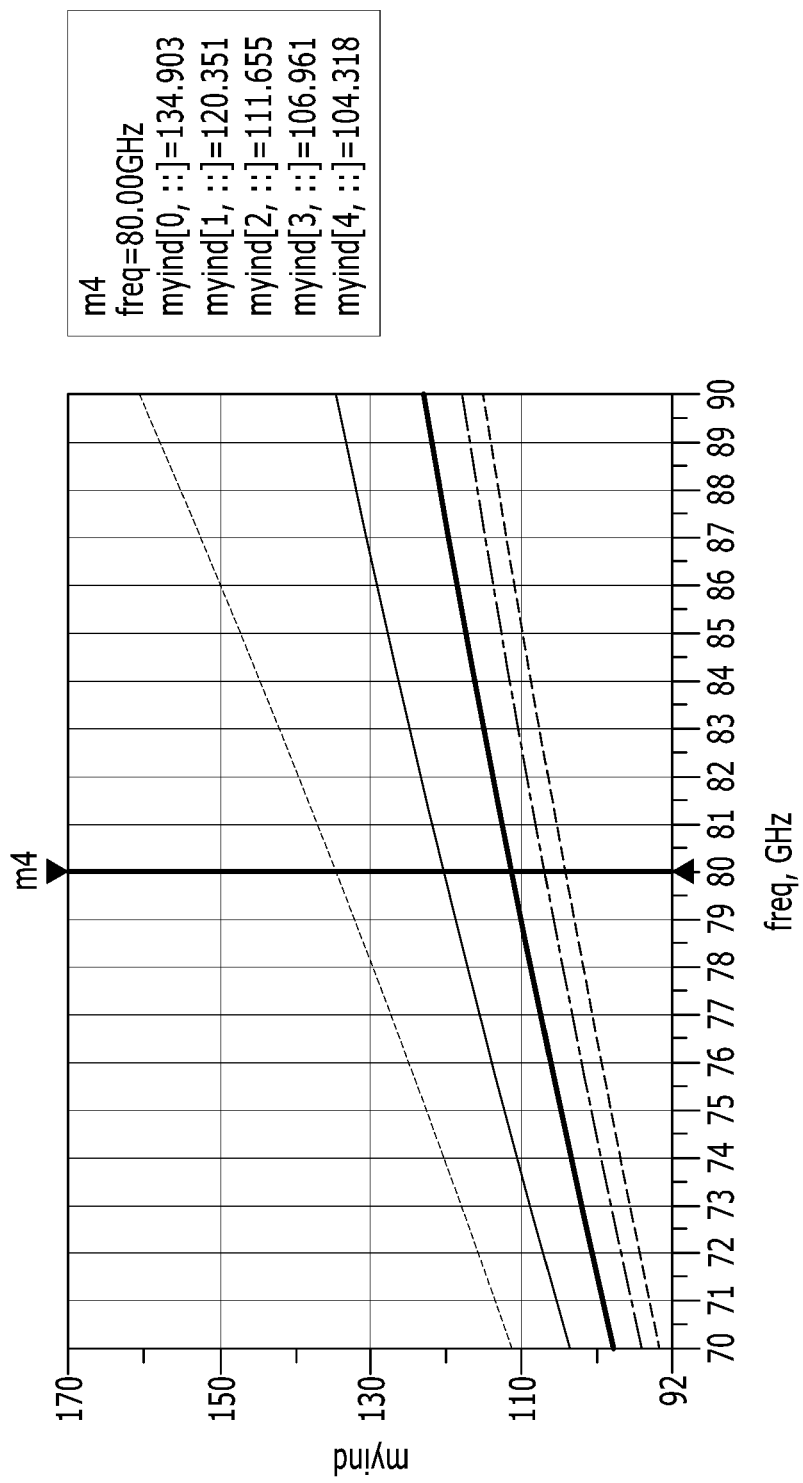
FIG. 11 illustrates a change in inductance according to a change in resistance value of a first variable resistor in the input matching unit according to the exemplary embodiment of the present invention.

FIGS. 9 and 10 are diagrams illustrating an input matching unit according to an exemplary embodiment of the present invention. FIG. 11 illustrates a change in inductance according to a change in resistance value of a first variable resistor in the input matching unit according to the exemplary embodiment of the present invention.

Referring to FIGS. 9 to 11, the input matching unit 331 may include a first matching metal layer 3311, a second matching metal layer 3312, a dielectric layer 3313, a first switch SW1, a second switch SW2, a first variable resistor VAR1, and a second variable resistor VAR2. FIG. 9 illustrates the first matching metal layer 3311 and the second matching metal layer 3312 on the X-Y plane. FIG. 10 illustrates the first matching metal layer 3311, the second matching metal layer 3312, and the dielectric layer 3313 in an X-Z cross-section.

The second matching metal layer 3312 may be formed in a coil shape (inductor shape) on the X-Y plane. One end of the coil-shaped second matching metal layer 3312 is connected to the third node N3, and the other end of the coil-shaped second matching metal layer 3312 is connected to the gate voltage terminal Vg.

The first matching metal layer 3311 may be formed in an opened ring shape (loop shape) on the X-Y plane and partially overlap the second matching metal layer 3312 with the dielectric layer 3313 interposed therebetween. The first matching metal layer 3311 and the second matching metal layer 3312 may be disposed so that one end of the second matching metal layer 3312 and one end of the first matching metal layer 3311 are adjacent to (overlap) each other. The first variable resistor VAR1 is adjacent to one end of the first matching metal layer 3311 and may be connected to the first matching metal layer 3311 through the first switch SW1. The second variable resistor VAR2 is adjacent to the other end of the first matching metal layer 3311 and may be connected to the first matching metal layer 3311 through the second switch SW2. That is, the first variable resistor VAR1 and the second variable resistor VAR2 may be connected to the first matching metal layer 3311 at different positions.

The first switch SW1 may operate by receiving the first control signal Cont1 from the controller 360. The first variable resistor VAR1 may be connected to or separated from the first matching metal layer 3311 by the operation of the first switch SW1.

The first variable resistor VAR1 receives the first control voltage Vcont1 from the controller 360. The resistance value of the first variable resistor VAR1 may vary according to the first control voltage Vcont1.

The second switch SW2 may operate by receiving the second control signal Cont2 from the controller 360. The second variable resistor VAR2 may be connected to or separated from the first matching metal layer 3311 by the operation of the second switch SW2.

The second variable resistor VAR2 receives the first control voltage Vcont1 from the controller 360. The resistance value of the second variable resistor VAR2 may vary according to the first control voltage Vcont1.

The controller 360 may apply different levels of the first control voltage Vcont1 to the first variable resistor VAR1 and the second variable resistor VAR2. Accordingly, the first variable resistor VAR1 and the second variable resistor VAR2 may have different resistance values.

When a signal is transmitted from the third node N3 to the gate voltage terminal Vg through the second matching metal layer 3312, an eddy current is generated in the opposite direction in the first matching metal layer 3311. The amount of eddy current increases toward one end of the first matching metal layer 3311 and decreases toward the other end of the first matching metal layer 3311. That is, the amount of eddy current at the portion to which the first variable resistor VAR1 is connected is greater than the amount of eddy current at the portion to which the second variable resistor VAR2 is connected.

The value of the eddy current of the first matching metal layer 3311 may be adjusted according to whether the first variable resistor VAR1 and the second variable resistor VAR2 are connected and the resistance value of the first variable resistor VAR1 and the resistance value of the second variable resistor VAR2. By adjusting the value of the eddy current, a Q value and an inductance value of the inductor may be controlled. That is, the inductance value of the input matching unit 331 may be variously controlled according to whether the first variable resistor VAR1 and the second variable resistor VAR2 are connected and the resistance value of the first variable resistor VAR1 and the resistance value of the second variable resistor VAR2.

FIG. 11 is a simulation result of a change in inductance value (myind) when only the first variable resistor VAR1 is connected to the first matching metal layer 3311 and the resistance value of the first variable resistor VAR1 is changed. It can be seen that the inductance value changes to 134.903, 120.351, 111.655, 106.961, and 104.318 when the resistance value of the first variable resistor VAR1 is changed to 30 ohm, 60 ohm, 90 ohm, 120 ohm, and 150 ohm at a frequency of 80 GHz.

The controller 360 may increase the inductance value by reducing the resistance value of the first variable resistor VAR1 (or the second variable resistor VAR2) when the voltage of the drain electrode of the transistor TR increases.

In this way, the inductance value of the input matching unit 331 may be controlled by controlling the resistance value of the first variable resistor VAR1 (or the second variable resistor VAR2), and accordingly, the optimal input impedance of the low noise amplifier 330 can be optimized.

In the exemplary embodiments of FIGS. 9 and 10, the case that two variable resistors are connected to the first matching metal layer 3311 was described as an example. However, the number of variable resistors connected to the first matching metal layer 3311 is not limited. When a larger number of variable resistors are connected to the first matching metal layer 3311 at different locations, the inductance value of the input matching unit 331 may be controlled more precisely. The inductance value of the input matching unit 331 may be adjusted by adjusting the number of resistors connected to the first matching metal layer 3311, the resistance value, the connection position, and the like.

The drawings and detailed description of the present invention referred to so far are only examples of the present invention, which are only used for the purpose of explaining the present invention, but are used to limit the scope of the present invention described in the meaning or claims. Therefore, it will be understood by those skilled in the art that various modifications and equivalent other embodiments are possible therefrom. Accordingly, an actual technical scope of the present invention is to be defined by a technical spirit of the following claims.

What is claimed is:

1. An adaptive receiver for a high output power system, comprising:
   a band-pass filter that receives a transmission signal output from a transmitter and outputs a transmission signal for canceling a leakage signal from which noise has been removed; and
   a leakage signal canceller that includes a first metal layer through which the transmission signal for canceling the leakage signal flows and a second metal layer through which a transmission leakage signal by the transmission signal flows,
   wherein the first metal layer and the second metal layer are disposed adjacent to each other to generate a coupling effect, the transmission leakage signal for canceling the leakage signal flows in a reverse direction to a direction in which the transmission leakage signal flows, and the transmission leakage signal is canceled.

2. The adaptive receiver of claim 1, wherein:
   the leakage signal canceller further includes a dielectric material layer positioned between the first metal layer and the second metal layer, and
   the first metal layer and the second metal layer overlap each other with the dielectric material layer interposed therebetween.

3. The adaptive receiver of claim 2, wherein:
   the second metal layer is formed in a coil shape on a plane, and
   the first metal layer is formed in an opened ring shape on the plane and partially overlaps the second metal layer.

4. The adaptive receiver of claim 1, wherein:
   the first metal layer and the second metal layer are positioned on the same layer and disposed to extend side by side at a certain distance.

5. The adaptive receiver of claim 1, wherein:
   the second metal layer is formed in a coil shape on a plane,
   the first metal layer extends and is disposed in an X-axis direction adjacent to a portion where the transmission leakage signal flows in an +X direction in the second metal layer, and
   the transmission signal for canceling the leakage signal flows in a −X direction in the first metal layer.

6. The adaptive receiver of claim 1, further comprising:
   a low noise amplifier that amplifies the received signal output by passing through the leakage signal canceller and removes noise; and
   a controller that controls a drain voltage and an inductance value of the low noise amplifier according to a magnitude of the transmission signal.

7. The adaptive receiver of claim 6, wherein
   the low noise amplifier includes:
   an input matching unit that is connected to the leakage signal canceller; and
   a transistor that includes a gate electrode connected to the input matching unit, a drain electrode connected to a power voltage terminal, and a source electrode connected to the ground, and
   the controller applies a control voltage to the drain electrode of the transistor, and increases the control voltage as the magnitude of the transmission signal increases to increase an input P1 dB of the low noise amplifier.

8. The adaptive receiver of claim 7, wherein
   the input matching unit includes:
   a first matching metal layer;
   a second matching metal layer that overlaps the first matching metal layer and has one end connected to the leakage signal canceller and the other end connected to the gate electrode of the transistor;
   a first variable resistor and a second variable resistor that are connected to the first matching metal layer at different positions;
   a first switch that receives a first control signal from the controller and connects or disconnects the first variable resistor to or from the first matching metal layer; and
   a second switch that receives a second control signal from the controller and connects or disconnects the second variable resistor to or from the second matching metal layer.

9. The adaptive receiver of claim 8, wherein:
the second matching metal layer is formed in a coil shape on a plane, and
the first matching metal layer is formed in an opened ring shape on the plane and partially overlaps the second matching metal layer.

10. The adaptive receiver of claim 8, wherein:
the controller increases the inductance value of the low noise amplifier by reducing a resistance value of the first variable resistor or a resistance value of the second variable resistor when a voltage of the drain electrode of the transistor increases.

11. A transceiver, comprising:
a transmitter that outputs a transmission signal to a first node;
a transmitting/receiving converter that includes a first terminal connected to the first node, a second terminal connected to an antenna, and a third terminal connected to a second node;
a leakage signal canceller that is connected to the second node, receives a signal transmitted from the transmitting/receiving converter, and attenuates a transmission leakage signal and transmits the attenuated transmission leakage signal to a third node; and
a band-pass filter that is connected to the first node to receive the transmission signal and outputs a transmission signal for canceling a leakage signal from which noise has been removed to a fourth node,
wherein the leakage signal canceller includes:
a first metal layer that includes one end connected to a resistor and the other end connected to the fourth node; and
a second metal layer that includes one end connected to the second node and the other end connected to the third node, and
the first metal layer and the second metal layer are disposed adjacent to each other to generate a coupling effect.

12. The transceiver of claim 11, wherein:
the leakage signal canceller further includes a dielectric material layer positioned between the first metal layer and the second metal layer, and
the first metal layer and the second metal layer overlap each other with the dielectric material layer interposed therebetween.

13. The transceiver of claim 12, wherein:
the second metal layer is formed in a coil shape on a plane, and
the first metal layer is formed in an opened ring shape on the plane and partially overlaps the second metal layer.

14. The transceiver of claim 11, wherein:
the first metal layer and the second metal layer are positioned on the same layer and disposed to extend side by side at a certain distance.

15. The transceiver of claim 11, wherein:
the second metal layer is formed in a coil shape on a plane,
the first metal layer extends and is disposed in an X-axis direction adjacent to a portion where the transmission leakage signal flows in an +X direction in the second metal layer, and
the transmission signal for canceling the leakage signal flows in a −X direction in the first metal layer.

16. The transceiver of claim 11, further comprising:
a low noise amplifier that is connected to the third node to receive and amplify the received signal output through the leakage signal canceller and remove noise;
a detector that is connected to the first node to detect the transmission signal; and
a controller that increases an input P1 dB of the low noise amplifier by increasing a drain voltage of the low noise amplifier as the magnitude of the transmission signal detected by the detector increases.

17. The transceiver of claim 16, wherein
the low noise amplifier includes:
a transistor;
a first matching metal layer;
a second matching metal layer that includes one end connected to the third node and the other end connected to a gate electrode of the transistor, and overlaps the first matching metal layer;
a first variable resistor and a second variable resistor that are connected to the first matching metal layer at different positions;
a first switch that receives a first control signal from the controller and connects or disconnects the first variable resistor to or from the first matching metal layer; and
a second switch that receives a second control signal from the controller and connects or disconnects the second variable resistor to or from the second matching metal layer, and
the controller increases an inductance value of the low noise amplifier by reducing a resistance value of the first variable resistor or a resistance value of the second variable resistor when a voltage of the drain electrode of the transistor increases.

* * * * *